United States Patent [19]

Yu

[11] Patent Number: 6,008,843
[45] Date of Patent: *Dec. 28, 1999

[54] COLOR CHARGE-COUPLED DEVICE

[75] Inventor: Young J. Yu, Seoul, Rep. of Korea

[73] Assignee: LG Semicon Co., Ltd., Chungcheongbuk-do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/768,946

[22] Filed: Dec. 18, 1996

[30] Foreign Application Priority Data

Dec. 19, 1995 [KR] Rep. of Korea .................. 95-52204

[51] Int. Cl.$^6$ ........................................... H04N 3/14
[52] U.S. Cl. .............................. 348/274; 348/273
[58] Field of Search ..................... 348/266, 272, 348/273, 274, 276, 280, 282, 340; 257/440; 438/70

[56] References Cited

U.S. PATENT DOCUMENTS

| | | | |
|---|---|---|---|
| 4,245,241 | 1/1981 | Sato et al. . | |
| 4,630,106 | 12/1986 | Morimura et al. | 358/44 |
| 4,745,327 | 5/1988 | Saeki et al. | 313/371 |
| 5,176,971 | 1/1993 | Shimamura et al. . | |
| 5,185,059 | 2/1993 | Nishida et al. . | |
| 5,350,490 | 9/1994 | Lee | 156/655 |
| 5,592,223 | 1/1997 | Takamura et al. | 348/309 |
| 5,595,930 | 1/1997 | Baek | 437/53 |
| 5,677,200 | 10/1997 | Park et al. | 437/3 |
| 5,774,182 | 6/1998 | Mutoh et al. | 348/311 |
| 5,804,845 | 9/1998 | Anagnostopoulos et al. | 257/231 |
| 5,854,098 | 12/1998 | Back et al. | 438/70 |

*Primary Examiner*—Wendy R. Garber
*Assistant Examiner*—Jacqueline Wilson
*Attorney, Agent, or Firm*—Finnegan, Henderson, Farabow, Garrett & Dunner, L.L.P.

[57] ABSTRACT

A color CCD includes a plurality of photo diodes, a color filter layer for making only light of predetermined wavelength pass through to each photo diode, and a plurality of poly silicon films formed on selected photo diodes. The color filter layer may be made of any one layer of dyeing layers of magenta and cyan or two overlapped dyeing layers of magenta and cyan.

13 Claims, 6 Drawing Sheets

COLOR CHARGE-COUPLED DEVICE

BACKGROUND OF THE INVENTION

1. Field of the Invention

The present invention relates to a color charge-coupled device (CCD). More particularly, the present invention relates to a color CCD that simplifies a fabrication process and improves a yield by improving the color filter construction.

2. Description of the Related Art

A conventional color CCD will be explained hereinafter with reference to the accompanying drawings. FIG. 1A is a view illustrating a layout of a conventional color CCD, and FIG. 1B is a sectional view illustrating a conventional color CCD construction.

Referring to FIG. 1B, the conventional color CCD includes a plurality of photo diodes 11 formed on a semiconductor substrate 10 at a predetermined interval, and a vertical charge coupled device VCCD 12 formed vertically between photo diodes 11 for transferring a signal produced by photoelectric conversion in the photo diodes 11 in one direction. An insulation layer 16 is formed over the entire surface of the semiconductor substrate 10 in which the photo diodes 11 and the VCCD 12 are located, and a plurality of polygates 17 are formed on the insulation layer on an upper surface of the VCCD 12 for transferring the signal produced in the photo diodes 11 to the VCCD 12, or for transferring the signal charge transferred to the VCCD 12 in one direction. A metal shielding layer 13 for shielding light is deposited over the polygates 17 except for those areas over light receiving regions in which the photo diodes 11 are located. A flat insulation film 18 is deposited over the entire surface of the semiconductor substrate 10 including the metal shielding layer 13. A color filter layer 14 of either red, green, or blue is then formed over each photo diode 11 corresponding to a pixel. A top coating layer 19 is deposited on the color filter layer 14. Finally, a microlens 15 is formed on the top coating layer for concentrating light on the photo diodes 11.

In the conventional color CCD, the color filter layer 14 of red, green, and blue separates the spectrum of incident light and allows only the light of each predetermined wavelength to be incident to the photo diodes 11.

The metal shielding layer prevents the light from being incident anywhere other than the photo diodes 11. The incident light described above is converted into an electric signal in the photo diodes 11 and transferred out to a processor. While the color CCD has many uses, manufacturing the conventional color CCD can be difficult and expensive.

The manufacturing process is complicated by the required three step dyeing process that is used to form the color filter layer. It is difficult to maintain uniformity of the colors during the dyeing process. Moreover, it is difficult to manufacture highly integrated, high density charge coupled devices with conventional multiple masking techniques, because of the more intricate masks required for the process and the tendency of the dyes to mix. Accordingly, mask mis-alignment makes it more difficult to maintain color separation.

SUMMARY OF THE INVENTION

The present invention overcomes the problems and disadvantages of the conventional CCD by providing a color CCD configuration that simplifies the fabrication process and improves the yield of the CCD device.

To achieve the objects and in accordance with the purpose of the invention, as embodied and broadly described herein, the color CCD includes a plurality of photo diodes, a color filter layer being located above the photo diodes, and including two color filter materials, each color filter material extracting light of predetermined color. At least one photo diode is located under a first color filter material, at least one photo diode is located under a second color filter material, and at least one photo diode is located under a region comprised of the first color filter material and the second color filter material.

In another aspect of the invention, the color CCD includes a plurality of photo diodes, a color filter layer made of two color filter materials, and poly silicon layers formed over at least two photo diodes. The color filter and poly silicon layers permit light of three predetermined wavelengths to pass through to the photo diodes, only one wavelength of light being incident to each photo diode.

Additional objects and advantages of the invention will be set forth in part in the description which follows, and will be apparent from the description. The objects and advantages of the invention will be realized and attained by means of the elements and combinations particularly pointed out in the appended claims.

BRIEF DESCRIPTION OF THE DRAWINGS

The accompanying drawings illustrate embodiments of the invention and, together with the description, serve to explain the principles of the invention. In the drawings.

DESCRIPTION OF THE PREFERRED EMBODIMENTS

Reference will now be made in detail to a preferred embodiment of the present invention, an example of which is illustrated in the accompanying drawings. Wherever possible, the same reference numbers will be used throughout the drawings to refer to the same or like parts.

Figure 1A:
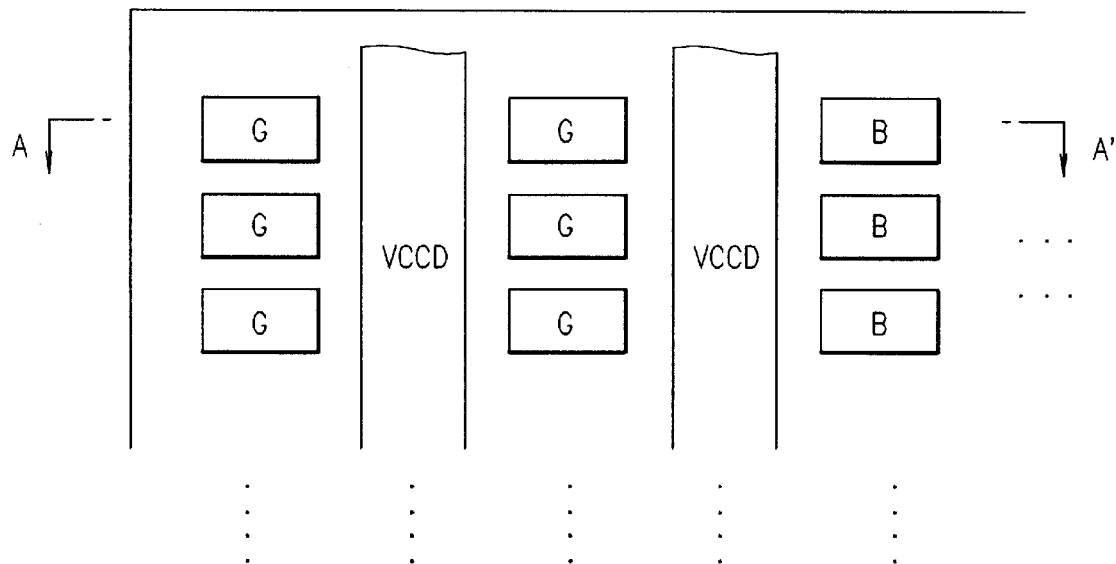
FIG. 1A is a view illustrating a layout of a conventional color CCD.
Figure 1B:
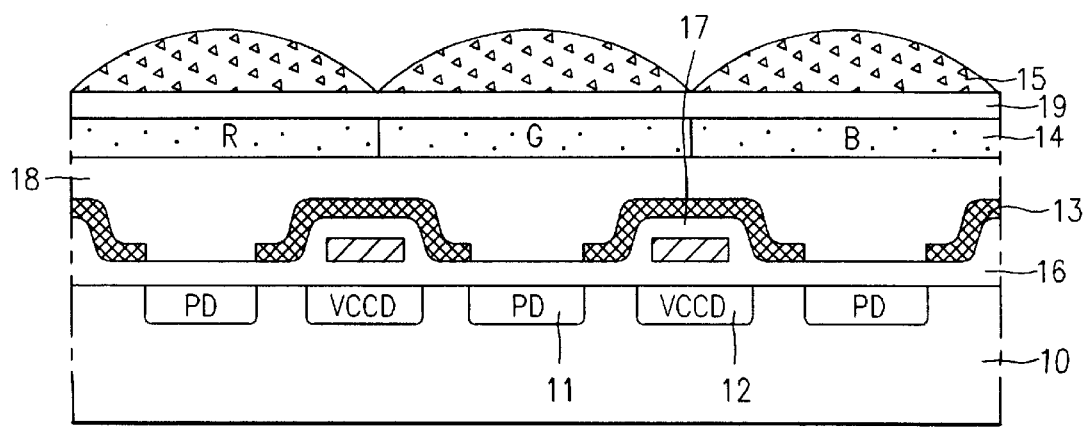
FIG. 1B is a sectional view illustrating a conventional color CCD construction.
Figure 2A:
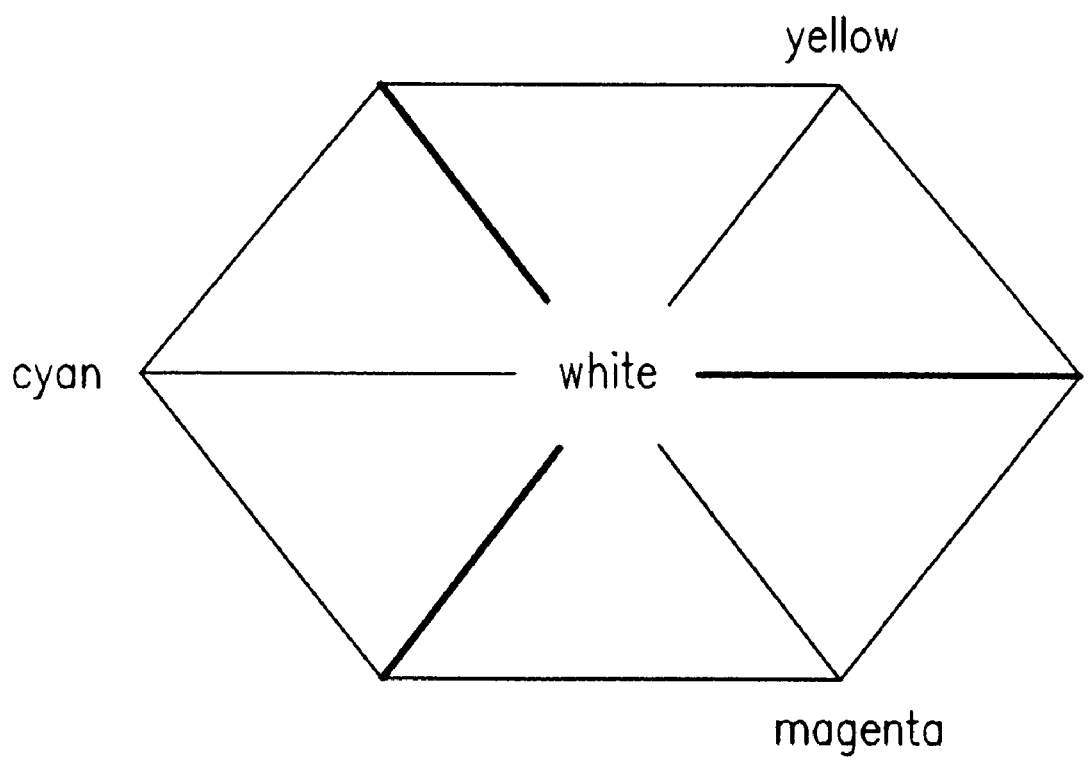
FIG. 2A is a color diagram.
Figure 2B:
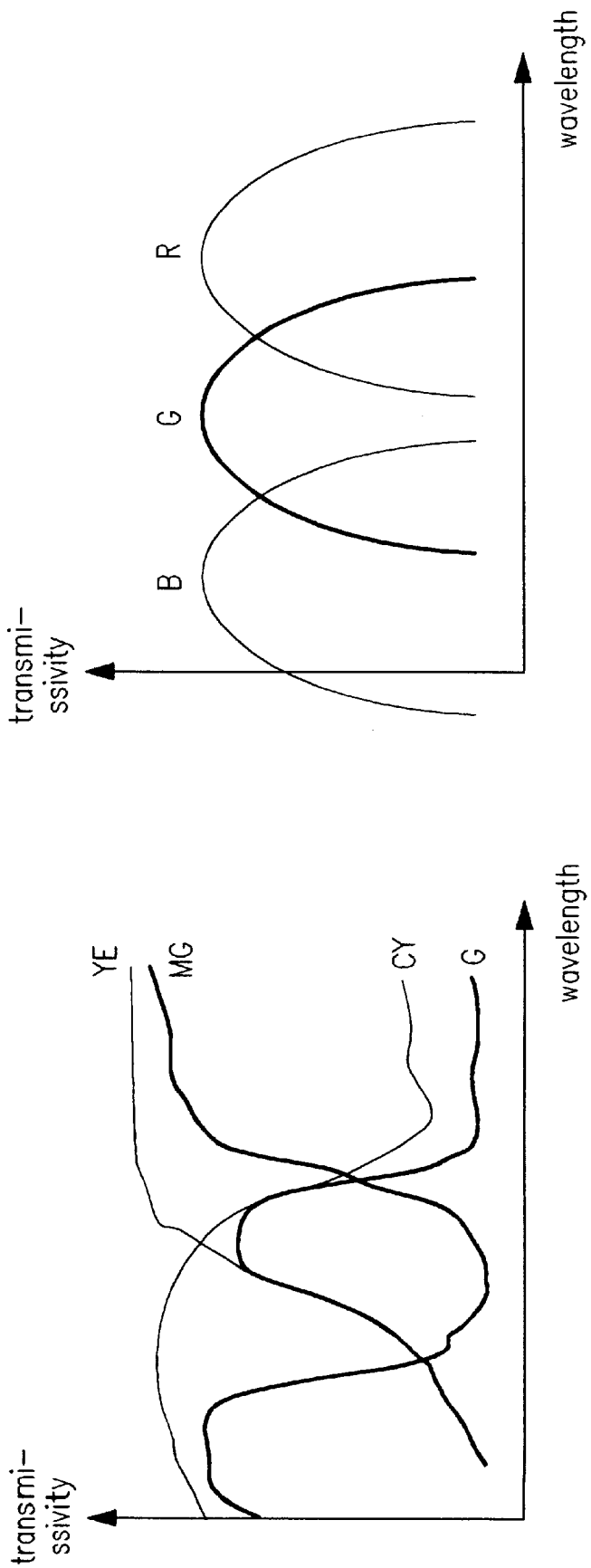
FIG. 2B is a graph illustrating individual color transmissivity of a color filter.

FIG. 2A is a color diagram, and FIG. 2B is a graph illustrating transmissivity of a color filter by color.

Light is an electromagnetic wave of extremely short wavelength and very high frequency. This electromagnetic wave stimulates retinas of eyes, and one senses the electromagnetic wave as visible light.

The wavelength range of visible light is about 380 nanometers to 780 nanometers. However, one does not sense every wavelength as the same color light. One senses different colors according to the wavelength of the particular color. A visible ray zone can be broadly divided into red, green, and blue.

A color filter may be formed to enable a black-and-white pick-up device to detect certain colors. The color filter may be made of organic material that allows only light of a predetermined wavelength band to pass and intercepts light outside of the predetermined wavelength band. For example, a blue filter allows only the blue band to pass and extracts the other color light.

A red, green, and blue filter has been applied to a color CCD. However, recently, a complementary color filter array of cyan, magenta, yellow and green having excellent transmissivity according to the wavelengths is applied, thereby improving optical sensitivity.

An object of the present invention is to provide a color CCD using fewer dyeing layers, thereby simplifying the construction of the device. To achieve this object, red, green, and blue signals are detected using only two dyeing layers and a poly silicon film that absorbs a blue wavelength band.

Figure 3A:
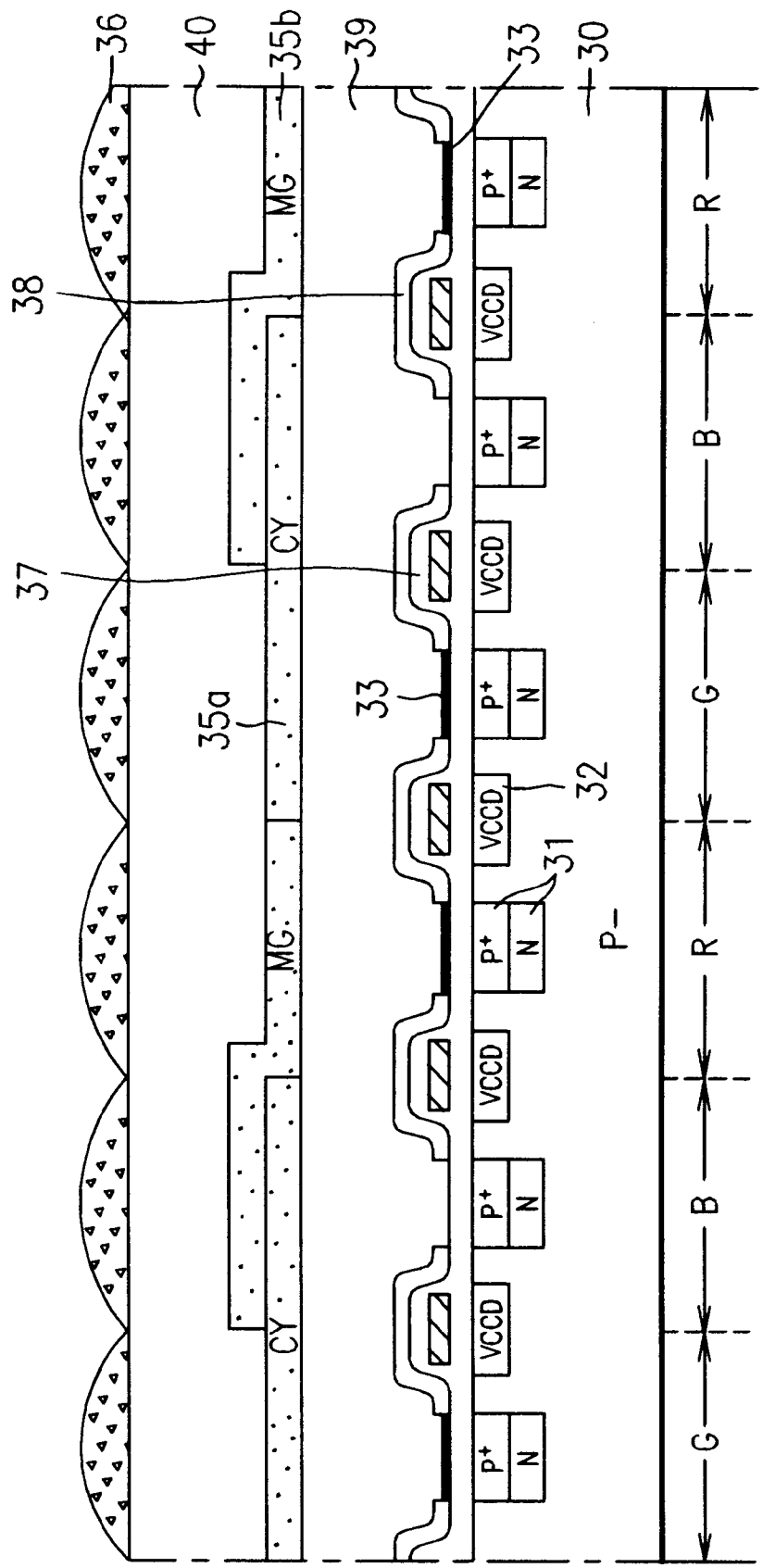
FIG. 3A is a sectional view illustrating a construction of a color CCD according to a preferred embodiment of the present invention.
Figure 3B:
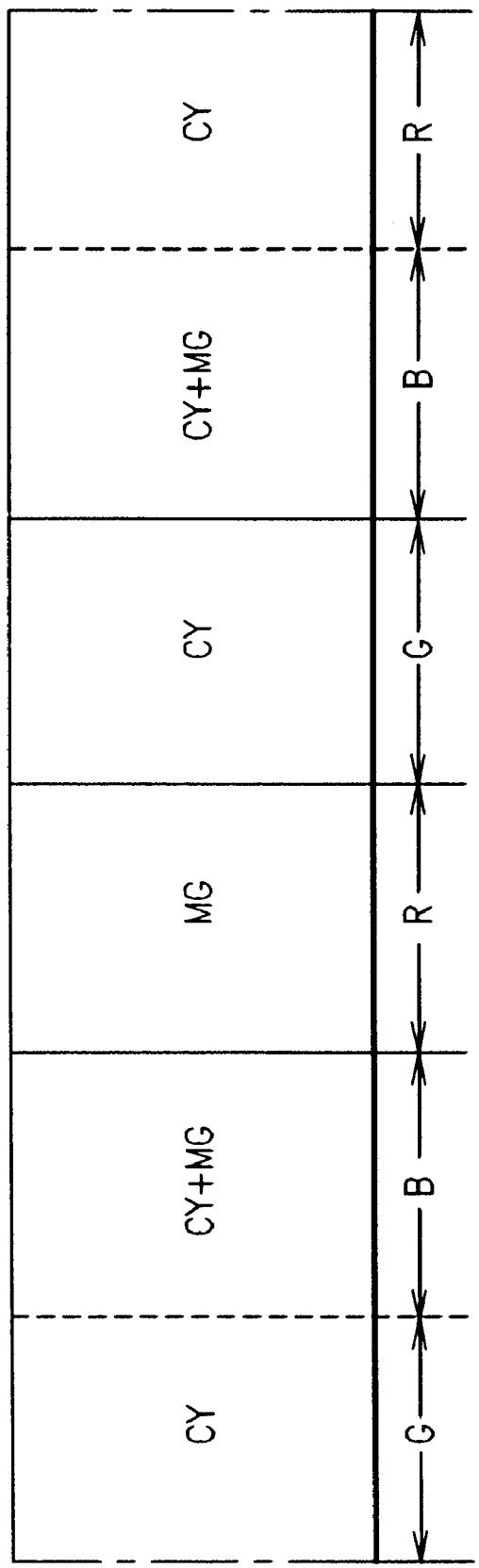
FIG. 3B is a view illustrating a layout of a color CCD according to a preferred embodiment of the present invention.

FIG. 3A is a sectional view illustrating a construction of a color CCD according to a preferred embodiment of the present invention, and FIG. 3B is a view illustrating a layout of a color CCD according to a preferred embodiment of the present invention.

Figure 4:
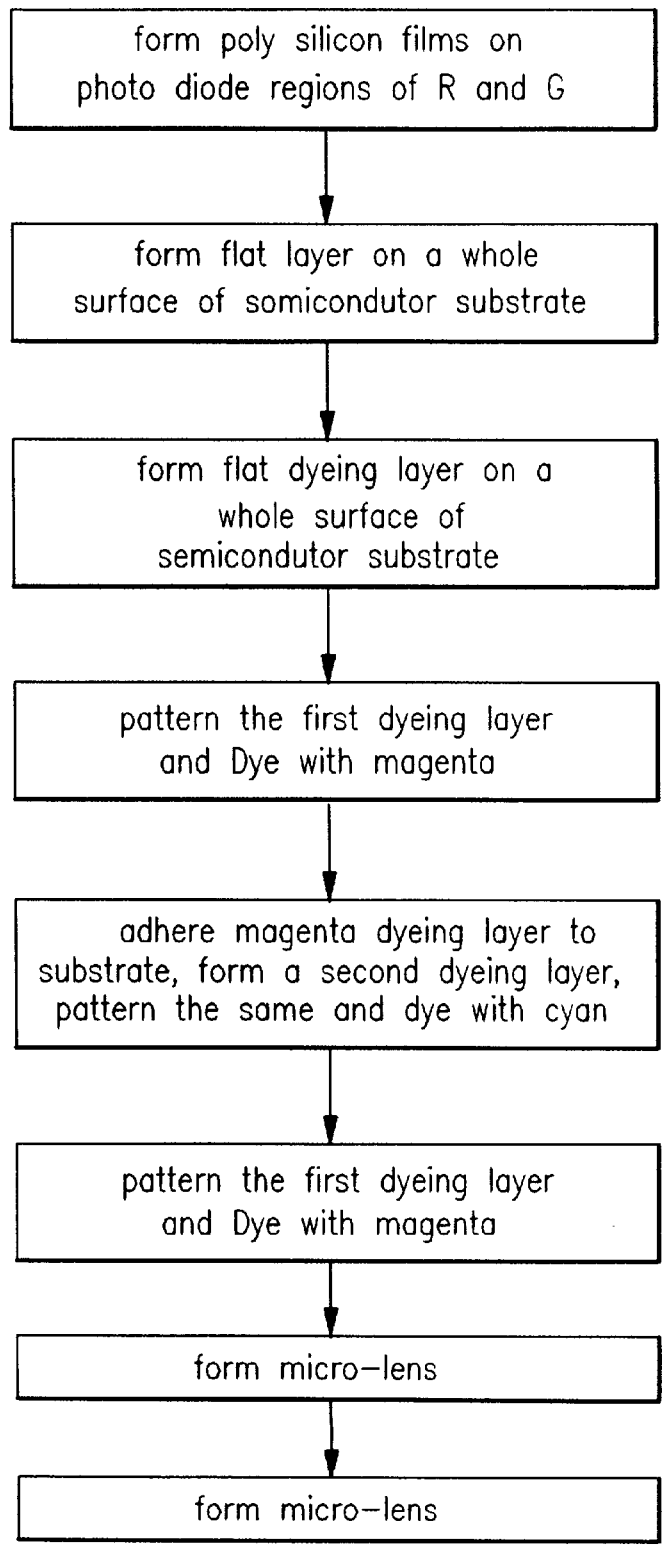
FIG. 4 is a flowchart illustrating a fabrication process of a color CCD according to a preferred embodiment of the present invention.

FIG. 4 is a flowchart illustrating a fabrication process of a color CCD according to a preferred embodiment of the present invention.

A color CCD according to the invention includes a plurality of photo diodes 31 formed at predetermined intervals in a semiconductor substrate 30. The CCD converts light to an electric signal. A vertical charge coupled device VCCD 32 may be used as a charge coupled device CCD channel for transferring charges produced in the photo diodes 31 in a predetermined direction. A plurality of polygates 37 transfer charges on the VCCD regions 32 in one direction. These polygates are insulated from each other. Poly silicon films 33 are selectively formed on the photo diodes 31 during formation of the polygates. A metal shielding layer 38 formed on the VCCD regions 32 prevents the light from being incident on regions other than the photo diodes 31 and a flat insulation film 39 is formed on the entire surface of the semiconductor substrate 30. Color filter layers 35a and 35b made of color filter materials are formed as two dyeing layers on the flat insulating film 39. One of these dyeing layers can be, for example, magenta and the other can be cyan. Microlens 36 correspond to each photo diode region 31 on a top coating 40 layered on the color filter layers 35a and 35b, and concentrate the light through the color filter to preselected light receiving regions, each region having a photo diode located therein.

Photo diodes of PN junction may be formed in the photo diodes 31 by ion-implanting $P^+$ type impurity on N-type impurity layers, and each $P^+$ type impurity layer in each photo diode region 31 may have a different thickness.

Specifically, the poly silicon films 33 are formed in at least two of the three photo diodes 31. The $P^+$ type impurity layer in the photo diodes 31 on which poly silicon films 33 are not formed is formed thinner than the $P^+$ type impurity layers in the photo diodes 31 on which the poly silicon films 33 are formed.

The magenta and cyan dyeing layers overlap in the color filter layers 35a and 35b over the photo diodes 31 on which the poly silicon films 33 are not formed. The individual magenta and cyan dyeing layers are formed respectively over the photo diodes 31 on which poly silicon films 33 are formed.

The preferred color CCD according to the present embodiment can detect all the colors derived from red, green and, blue by using only two dyeing layers: one being magenta and the other being cyan.

A red component is detected by the photo diodes 31 formed under the color filter layer made of one dyeing layer of magenta. When the light concentrated by the microlens 36 passes through the color filter layer made of the dyeing layer of magenta, the green component is extracted from the incident light while the red and blue components pass as illustrated in FIGS. 2A and 2B (combination ratio of red: green: blue for magenta is 0.5:0:0.5).

The blue component is absorbed by the poly silicon films 33 having a short wavelength absorption characteristic. Any residual blue component is completely absorbed as it passes through the $P^+$ type impurity layers. Therefore, only the red component is detected by the photo diode.

A green component is detected by the photo diodes 31 formed under the color filter layer made of one dyeing layer of cyan. When the light concentrated by the microlens 36 passes through the color filter layer made of the cyan dyeing layer, the red component is extracted from the incident light, while the green and blue components pass as illustrated in FIGS. 2A and 2B (combination ratio of red: green: blue for cyan is 0:0.5:0.5).

The blue component is absorbed by the poly silicon films 33 having a short wavelength absorption characteristic. Any residual blue component is completely absorbed as it passes through the $P^+$ type impurity layers. Therefore, only the green component is detected by the photo diode.

The blue component can be absorbed to the desired extent by controlling the thickness of the poly silicon films 33 and the thickness of the $P^+$ type impurity layers.

The blue component is detected by the photo diodes 31 corresponding to the color filter layer in which the dyeing layers of magenta and cyan are overlapped. When the light concentrated by the microlens 36 passes through the color filter layers of magenta and cyan, the red component is extracted by the cyan layer, and the green component is extracted by the magenta layer. Therefore, only the blue component passes as illustrated in FIGS. 2A and 2B.

The poly silicon films 33 are not formed in the photo diodes under the overlapped color filter layers of magenta and cyan and the $P^+$ type impurity layers are thin. Therefore, excessive absorption of the blue component prevented, allowing the photo diodes formed under the overlapped cyan and magenta dyeing layers to detect the blue component of light.

This effect is produced regardless of whether the cyan layer overlaps the magenta layer, or the magenta layer overlaps the cyan layer.

As described above, the color CCD can reduce the number of mask processes by reducing the number of required dyeing processes. Detecting red, green, and blue light signals from a device requiring only two dyeing processes is therefore possible.

In addition, it is possible to reduce the probability of mis-alignment because the defining region may be wide during the mask process, thereby overcoming any disadvantages resulting from mixed colors.

Finally, it is easier to handle the dyes because only two colors of the three primary colors of dye are used, and it is therefore possible to reduce unevenness.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A color CCD, comprising:

a plurality of photo diodes;

a color filter layer being located above said photo diodes, and comprised of two color filter materials, each color filter material extracting light of predetermined color;

wherein at least one photo diode is located under a first color filter material, at least one photo diode is located under a second color filter material, and at least one photo diode is located under a region comprised of the first color filter material and the second color filter material; and wherein poly silicon films are formed over the photo diode located under the first color filter material and the photo diode located under the second color filter material.

2. The color CCD of claim 1, wherein a charge coupled device CCD channel region is formed vertically between the photo diodes.

3. The color CCD of claim 1, wherein the region comprised of the first color filter material and the second color filter material is made of a layer of the first color filter material overlapping a layer of the second color filter material.

4. The color CCD of claim 1, wherein the region comprised of the first color filter material and the second color filter material is made of a layer of the second color filter material overlapping a layer of the first color filter material.

5. The color CCD of claim 1, wherein the photo diodes comprise $P^+$ type impurity layers formed over N-type impurity layers.

6. The color CCD of claim 5, wherein the $P^+$ type impurity layer of the photo diode under the region comprised of the first color filter material and the second color filter material is thinner than the $P^+$ type impurity layer of the photo diode under the first color filter material and the $P^+$ type impurity layer of the photo diode under the second color filter material.

7. The color CCD of claim 1, wherein the first color material extracts red light, the second color filter material extracts green light, and the poly silicon film extracts blue light.

8. The color CCD of claim 1, wherein the first color material is a layer of cyan, the second color filter material is a layer of magenta.

9. A color CCD, comprising:

a plurality of photo diodes;

a color filter layer consisting of two color filter materials; and poly silicon layers formed over at least two photo diodes;

wherein the color filter and poly silicon layers permit light of three predetermined wavelengths to pass through to the photo diodes, only one wavelength of light being incident to each photo diode.

10. The color CCD of claim 9, wherein the photo diodes comprise $P^+$ type impurity layers formed over N-type impurity layers.

11. The color CCD of claim 9, wherein one color filter material is a layer of cyan and the other color filter material is a layer of magenta.

12. The color CCD of claim 11, wherein the layers of cyan and magenta overlap in at least one region over at least one photo diode.

13. The color CCD of claim 9, wherein the three predetermined wavelengths of light correspond to red, green, and blue.

* * * * *